United States Patent

Schneider et al.

[11] Patent Number: 5,159,712
[45] Date of Patent: Oct. 27, 1992

[54] RADIO INTEGRATED WITH BICYCLE HANDLEBARS

[75] Inventors: Ronald J. Schneider, Cleves; Andrew J. Bean; Wayne Beiser, both of Cincinnati, all of Ohio

[73] Assignee: Huffy Corporation, Dayton, Ohio

[21] Appl. No.: 652,718

[22] Filed: Feb. 8, 1991

[51] Int. Cl.⁵ .......................... H05K 11/00; B62J 9/00
[52] U.S. Cl. .................................... 455/344; 455/351; 361/422; 224/30 R; 224/30 A
[58] Field of Search ............... 455/344, 345, 346, 347, 455/348, 350, 351; 224/30 R, 30, 30 A, 31; 361/422

[56] References Cited

U.S. PATENT DOCUMENTS

| | | | |
|---|---|---|---|
| D. 281,871 | 6/1985 | Heiman | 12/114 |
| 1,908,535 | 8/1933 | Pawsat . | |
| 2,588,671 | 10/1952 | Tringali | 224/30 |
| 3,193,232 | 11/1965 | Hatcher | 248/226 |
| 3,380,698 | 1/1968 | Goldberg | 248/229 |
| 3,598,295 | 4/1971 | Seegers | 224/41 |
| 4,176,770 | 7/1979 | Griggs et al. | 224/30 |
| 4,436,350 | 3/1984 | Jolin | 312/7.1 |
| 4,445,228 | 7/1984 | Bruni | 381/24 |
| 4,662,547 | 1/1987 | Villanueva et al. | 224/30 |
| 4,754,901 | 10/1988 | Villanueva et al. | 224/30 |
| 4,971,320 | 11/1990 | Nesbit et al. | 455/344 |

FOREIGN PATENT DOCUMENTS 1032055  3/1953  France ............................ 455/351

OTHER PUBLICATIONS

Radio Shack, Catalog #225, p. 26, Jul. 1972.

*Primary Examiner*—Curtis Kuntz
*Assistant Examiner*—Timothy H. Keough
*Attorney, Agent, or Firm*—Biebel & French

[57] ABSTRACT

An audio accessory is provided for mounting to the handlebar of a bicycle. The accessory includes a housing for containing an electronic audio system such as a radio and elongated concavely shaped side portions for engaging upwardly extending diverging extensions of the bicycle handlebar. A pair of straps attached to the front and rear of the housing wrap around the extensions of the handlebars to hold the housing firmly in position in wedging contact with the handlebar.

19 Claims, 2 Drawing Sheets

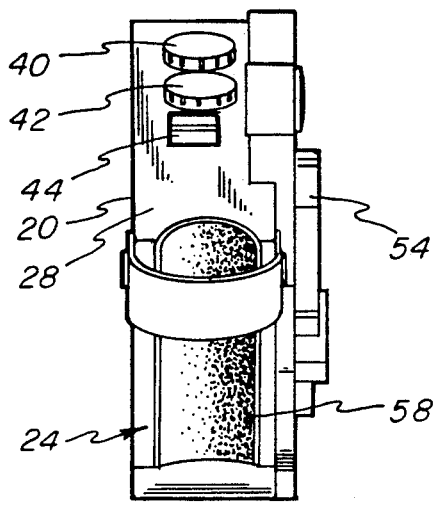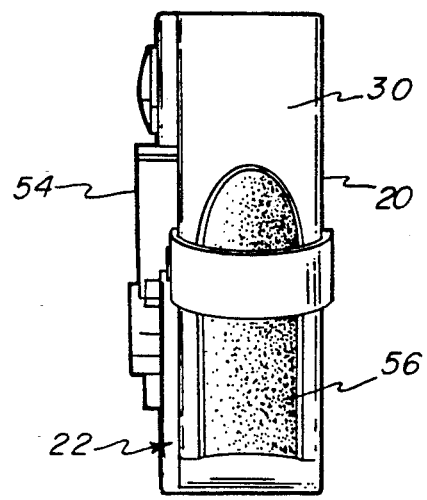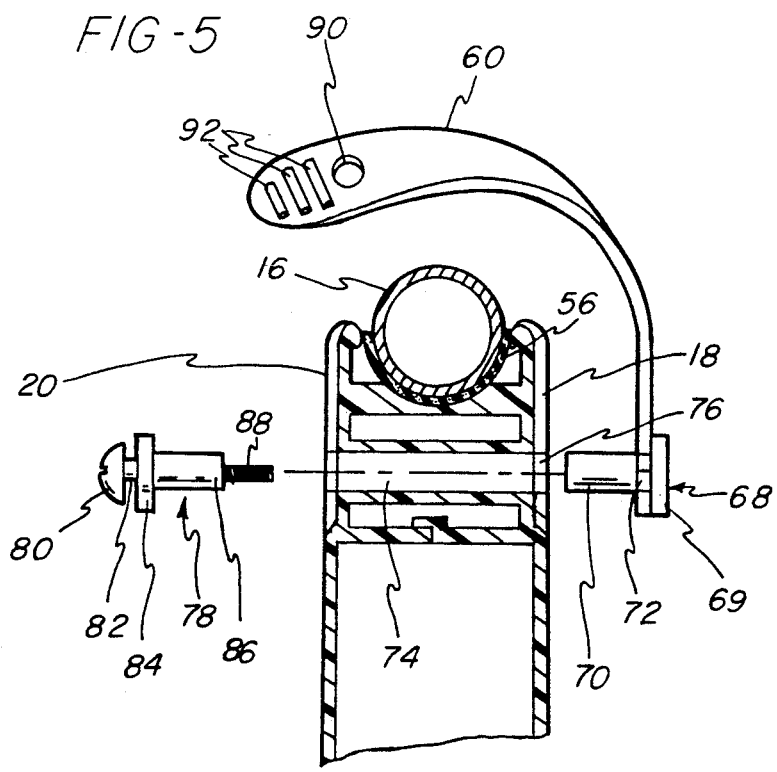

RADIO INTEGRATED WITH BICYCLE HANDLEBARS

BACKGROUND OF THE INVENTION

The present invention relates generally to audio accessories which are adapted to be mounted to bicycle handlebars and, more particularly, to a radio accessory which is formed to be mounted in direct contact with a bicycle handlebar without requiring the use of intermediate mounting brackets.

In order to provide an audio system for vehicles having handlebars, such as bicycles, it has been common to provide the handlebars with a mounting system whereby a portable audio system may be conveniently mounted to the bicycle. U.S. Pat. Nos. 3,193,232 to Hatcher and 3,380,698 to Goldberg et al showed typical radio mounting systems wherein a bracket is provided and a portable radio may be strapped or clamped within the bracket.

An alternative mounting bracket and speaker system is shown in U.S. Pat. No. 4,662,547 to Villanueva et al which shows a main body for carrying audio equipment such as radios or tape players and a pair of speakers permanently mounted to the main body for connection to the audio equipment being carried. The audio equipment carrying systems disclosed by the above prior art patents are similar in use in that they typically all include portions which must be permanently attached to the bicycle handlebars and which include some sort of clamping means whereby the audio equipment may be attached to the mounting brackets. Such systems result in an unattractive appearance when the audio equipment is detached from the bicycle and often appear bulky when positioned in accordance with their designed use.

Accordingly, there is a need for a bicycle radio which may be easily integrated with a bicycle handlebar and which may be quickly detached from a bicycle handlebar to be carried with the operator when the bicycle is not in use. Further, there is a need for an attractive radio which does not detract from the appearance of the bicycle and which does not require the use of brackets permanently or semi permanently mounted to the handlebars of the bicycle.

SUMMARY OF THE INVENTION

The present invention provides an audio accessory which may be mounted to the handlebar of a bicycle. The accessory includes a housing for containing an electronic audio system, for example the circuitry for a radio, and includes opposing concavely shaped side portions for engaging the handlebar. A pair of straps are attached to the housing adjacent to each of the side portions and are adapted to extend around the handlebar to hold the housing and handle bar in wedging contact with each other.

The audio accessory is particularly designed to be used with a bicycle having a handlebar which includes opposed upwardly diverging extensions, such as are found on high rise handlebars. The side portions of the housing are formed to diverge upwardly whereby they may engage the diverging extensions of the handlebar. In addition, the side portions may be formed of a resiliently compressible surface to facilitate producing a frictional engagement with the handlebar for maintaining the accessory in position.

The accessory is further formed with a pair of rearwardly facing speakers to provide an audio output for the accessory. In addition, the front face of the housing includes two portions having regularly spaced indentations forming a pair of simulated speakers having a size and shape resembling the appearance of the speakers on the back face.

The housing is also formed with a top surface and an additional upwardly and inwardly extending surface which connects the top surface to one of the side portions such that the housing is formed with a non-symmetrical shape. Controls for the audio accessory are located along the top surface and may include knobs for controlling the volume and tuning of a radio, and a switch for selecting between AM and FM bands of the radio.

Other objects and advantages of the invention will become apparent from the following description, the accompanying drawings, and the appended claims.

BRIEF DESCRIPTION OF THE DRAWING

FIG. 3 is an elevational view of the left side of the audio accessory;

FIG. 4 is an elevational view of the right side of the audio accessory; and

FIG. 5 is a partially exploded view of the means for attaching the audio accessory to a portion of the handlebars.

DETAILED DESCRIPTION OF THE PREFERRED EMBODIMENT

Figure 1:
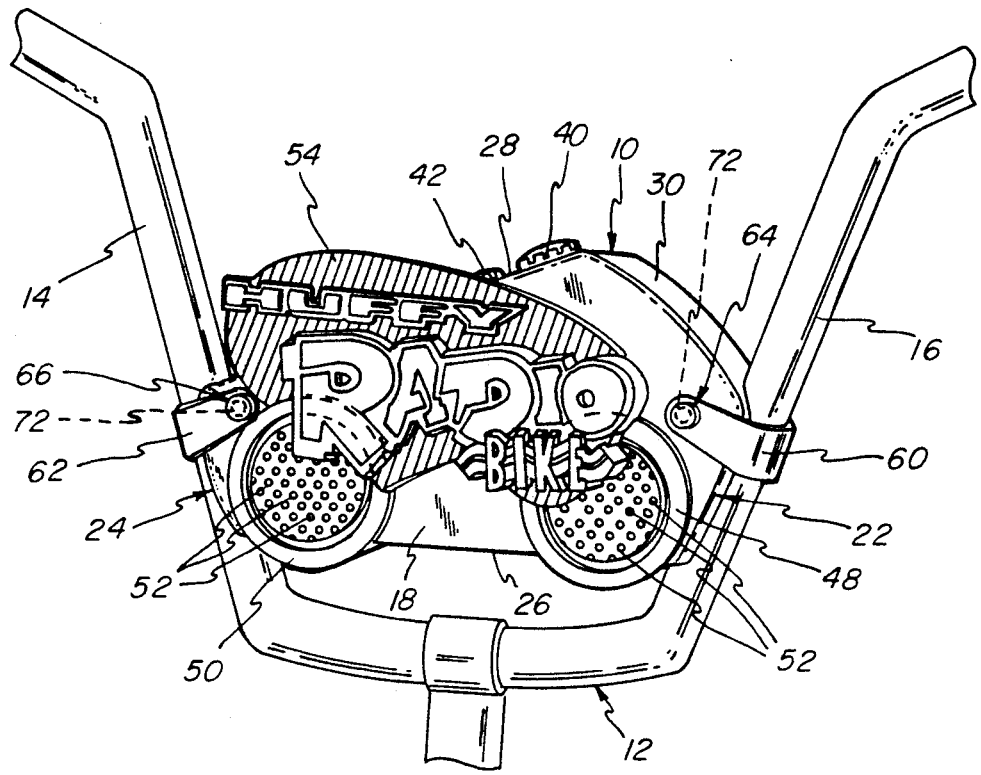
FIG. 1 is a front perspective view of the audio accessory of the present invention mounted to a bicycle handlebar.
Figure 2:
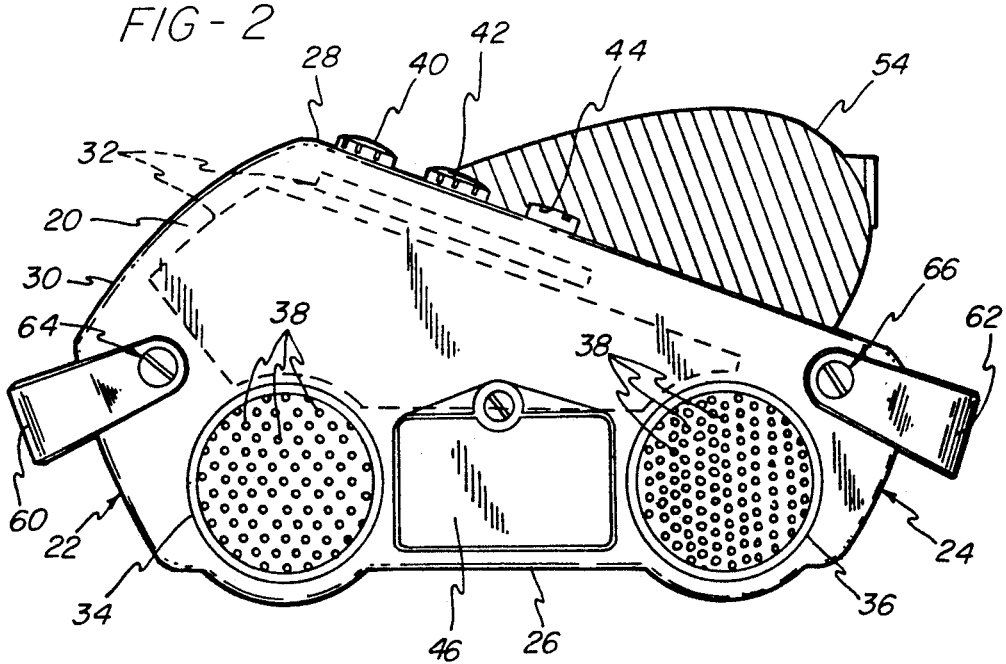
FIG. 2 is a rear elevational view of the audio accessory.

Referring initially to FIGS. 1 and 2, the audio accessory of the present invention is depicted as a radio 10 which may be attached to bicycle handlebars 12 having a pair of upwardly diverging extensions 14,16, which are commonly referred to as high rise handlebars. The radio 10 includes a housing which is preferably formed of a molded plastic, and the housing has a substantially planer front face 18 and rear face 20.

A left side portion 22 and right side portion 24 extend between the front and back faces 18,20 and a bottom wall 26 extends along the bottom of the housing between the two side portions 22,24. The top of the housing is defined by a top wall 28 extending from the right side portion 24 toward the left side portion 22, and an additional wall portion 30 extends upwardly from the left side portion 22 and angles inwardly to intersect the end of the top wall 28. Thus, the housing for the radio 10 is formed as a hollow case for housing the electronic components of radio, such as an electronic circuit board which is depicted diagrammatically at 32.

Referring to FIG. 2, it can be seen that the back face 20 is provided with a pair of circular speaker portions 34,36, each having means defining a plurality of apertures 38 through the housing. A conventional weather resistant mylar speaker is mounted behind the apertures 38 and within the housing at each of the speaker portions 34,36 to provide an audio output for the radio 10.

Further, it should be noted that the interior of the housing is sealed from the exterior such that the radio 10 is formed as a weather resistant structure which prevents moisture from entering into contact with any of the electrical components.

A volume and on/off knob 40 is provided mounted to the top wall 28 of the housing for controlling power to and the volume of the radio, and a tuning knob 42 is provided for selecting a station for the radio. Further, a slide switch 44 may be provided for selecting between AM and FM bands of the radio. The housing is also provide with a door 46 located on the back face 20 between the two speaker portions 34,36 for providing access to a battery compartment within the radio 10.

As may be seen in FIG. 1, the front face 18 of the radio 10 is provided with a pair of circular portions 38,50 which are designed to resemble the speaker portions 34,36 in both size and shape. In addition, a plurality of indentation 52 are molded into the front face 18 within the circular portions 48,50 to resemble the apertures 38 formed in the back face 20 and thus give the portions 48,50 the appearance of being additional speakers. The front face 18 may be further provided with a foam face plate 54 having raised lettering which provides the front portion of the radio 10 with an attractive contoured appearance at the front face 18.

Referring to FIGS. 3 and 4, it can be seen that the side portions 22,24 are formed with elongated concavely shaped indentations as defined by inserts 56,58 located within the side portions 22,24. The inserts 56,58 are preferably formed of a foam rubber material which is resiliently compressible. Further, it should be noted that the side portions 22,24 diverge upwardly and outwardly to match the angle formed by the extensions 16 and 14 of the handlebar 12. Thus, as the housing of the radio 10 is moved downwardly between the extensions 14 and 16, the concave inserts 56,58 of the side portions 22,24 move into wedging engagement with the extensions 14,16 resulting in the inserts 56,58 being slightly compressed to hold the radio 10 in position.

Left and right straps 60,62 are attached to the front and rear faces 18,20 of the housing and extend around the handlebar extensions 14,16 to further hold the radio 10 in position. The straps 60,62 are held in position by attachment or fastener means 64,66 which extend through apertures in the housing. The straps 60,62 are preferably formed of an elastic material such as Kraton produced by Shell Chemical Company of Houston, Tex. which may be stretched around the extensions 14,16 to form a tight compressive fit between the extensions 14,16 and the side portions 22,24.

Details of the strap 60 and its attachment to the housing is shown in FIG. 5. The fastener 64 includes a front portion 68 having an enlarged head 69, an elongated hollow shank 70 and an intermediate non-circular portion 72 which preferably has a square cross section which passes through an aperture in the strap 60. The housing is formed with a through aperture 74 passing from the front face 18 to the back face 20 and having a non-circular portion 76 for cooperating with the intermediate portion 72 to prevent the front fastener portion 68 from rotating relative to the housing.

The fastener 64 is further provided with a back portion 78 having a head portion 80, an intermediate shank portion 82, a radially extending seat portion 84 and an elongated end shank portion 86 having a threaded end portion 88 for cooperating with threads within the hollow shank portion 70 to hold the opposing portions 68,78 of the fastener 64 together.

The strap 60 includes means defining an aperture 90 which, due to the resiliency of the material forming the strap 60, may be expanded to pass over the head 80, and the head 80 operates as catch means to retain the strap 60 in position on the intermediate shank portion 82. In addition, a plurality of protruding ribs 92 are located on the end of the strap 60 to facilitate gripping the strap 60 as the aperture 90 is passed over the head 80 to attach the radio 10 to the handlebar 12. Thus, the operator may quickly attach the radio 10 to a pair of bicycle handlebars 12 when it is desired to ride the bicycle, and completely detach the radio and mounting means from the handlebars 12 to carry the radio 10 when the bicycle is not in use.

Alternatively, if it is desired to permanently mount the radio 10 to the handlebar 12, the elongated shank portion 78 may be passed through the aperture 90 such that the seat portion 84 sandwiches the strap 64 between the seat portion 84 and the back face 20 of the housing with the shank end portion 88 threadably engaging the interior of the hollow shank portion 70. Such a mounting may be preferred for uses where the bike is on display, such as within a store, or other uses where it is desired to leave the radio in place on the handlebar 12 and it is possible that theft of the radio 10 may occur.

From the above description it should be apparent that the present invention provides a radio which may be conveniently integrated with a bicycle handlebar and which may be quickly detached from the handlebar when not in use. Further, the present invention allows the radio to be mounted directly to the handlebar without the need for intermediate mounting brackets.

While the form of apparatus herein described constitutes a preferred embodiment of the invention, it is to be understood that the invention is not limited to this precise form of apparatus and that changes may be made therein without departing from the scope of the invention which is defined in the appended claims.

What is claimed is:

1. An audio accessory for mounting to a handlebar of a bicycle, said accessory comprising:
    a housing for containing an electronic audio system, said housing including top and bottom portions and opposing side portions for engaging said handlebar, said opposing side portions extending between said top and bottom portions;
    first and second straps attached to said housing adjacent to each of said side portions for extending around said handlebar to hold said housing in place; and
    wherein each of said side portion define concave surfaces located on opposing sides of said housing such that said straps may hold said concave side portions in wedging engagement with said handlebar.

2. The accessory of claim 1, wherein said housing is adapted to be mounted on a handlebar having opposed upwardly diverging extensions and said side portions diverge upwardly to engage said diverging extensions of said handlebar.

3. The accessory of claim 1, wherein each of said side portions include a resiliently compressible surface for contacting said handlebar.

4. The accessory of claim 1, wherein said housing further includes front and back faces, said front and back faces each including an attachment point for each of said straps.

5. The accessory of claim 4, including attachment means provided on an end of each of said straps whereby said straps may be detachably attached to one of said front and back faces.

6. The accessory of claim 4, wherein said steps are provided with means defining an aperture and one of said front and back attachment points for each of said straps includes catch means for passing through said aperture in an associated one of said straps, said catch means including means for detachably retaining said straps in position at said attachment points.

7. The accessory of claim 6, wherein said front and back attachment points for said first and second straps are formed by first and second bolt assemblies, respectively, passing through said front and back faces of said housing, said catch means being formed on said bolt assemblies and including and enlarged head portion, said straps being formed of a resilient material such that said apertures in said straps may be expanded to pass over said head portions and said straps will subsequently be held in position between a respective one of said head portions and said housing.

8. The accessory of claim 7, wherein said belt assemblies each include a radially extending seat portion located between said head portion and said housing and a shank portion connecting said head and seat portions and extending into said housing, said shank portion being adapted to pass through said aperture in a respective strap whereby said seat engages said strap to sandwich said strap between said seat and said housing such that said strap is immovably attached to said housing.

9. The accessory of claim 1, wherein said housing includes a front face, a back face and a top surface extending between said front and back faces, one of said faces including a speaker.

10. The accessory of claim 9, wherein the face opposite from said face including said speaker is formed with a molded surface having regularly spaced indentations simulating a speaker.

11. The accessory of claim 9, wherein said accessory is a radio and includes a pair of knobs and a switch located on said top surface, said knobs providing means for tuning and for controlling the volume of said radio, and said switch providing means for selecting a band.

12. The accessory of claim 9, including a foam face plate attached to said front face, said face plate including raised lettering.

13. The accessory of claim 1, wherein said housing includes a front face, a back face and a top surface extending between said front and back faces, said back face including a speaker, said front face of said housing being formed with a molded surface having regularly spaced indentations forming a simulated speaker portion.

14. The accessory of claim 13, including two speakers positioned at said back face and two portions of said front face molded having a plurality of spaced indentations forming simulated speakers, said simulated speakers having an appearance resembling said speakers at said back face in size and shape.

15. A radio accessory for mounting to a handlebar of a bicycle, said accessory comprising:
a housing for containing a radio including a pair of speakers;
said housing having a front and a back face and opposing side portions which define concave surfaces for engaging said handlebar, each of said speakers being positioned adjacent to a side portion;
first and second resilient elongated straps attached to said housing adjacent to each of said side portions;
means defining an aperture in an end of each of said straps; and
catch means located on a face of said housing adjacent to each of said side portions, said catch means being formed to engage said apertures in said straps such that said straps may be extended from one face of said housing and attached to the other face thereof at said catch means to hold said handle bar and said side portions in wedging contact with each other.

16. The accessory of claim 15, wherein said side portions are formed of a resilient material which may be compressed as said side portions are positioned in contact with said handlebar.

17. The accessory of claim 15, including a top surface and an upwardly and inwardly angled surface extending between said top surface and one of said side portions such that said housing is formed having a non-symmetrical shape.

18. The accessory of claim 15, wherein said catch means includes a pair of fasteners, each having an enlarged head which said aperture in said straps may pass over to hold said straps in engagement with said catch means.

19. The accessory of claim 15, wherein said housing is adapted to be mounted on a handlebar having opposed upwardly diverging extensions and said side portions diverge upwardly to engage said diverging extensions of said handlebar.

* * * * *

UNITED STATES PATENT AND TRADEMARK OFFICE
CERTIFICATE OF CORRECTION

PATENT NO. : 5,159,712
DATED : October 27, 1992
INVENTOR(S) : Ronald J. Schneider It is certified that error appears in the above-identified patent and that said Letters Patent is hereby corrected as shown below:

On the Title page, item [56]
In the "References Cited"

| | | |
|---|---|---|
| Heiman | − | "6/1985" should be --12/1985--. |
| Pawsat | − | "8/1933" should be --5/1933--. |
| Tringali | − | "10/1952" should be --3/1952--. |
| Hatcher | − | "11/1965" should be --7/1965--. |
| Seegers | − | "4/1971" should be --8/1971--. |
| Griggs | − | "7/1979" should be --12/1979--. |
| Bruni | − | "7/1984" should be --4/1984--. |
| Villanueva et al | − | "1/1987" should be --5/1987--. |
| Villanueva et al | − | "10/1988" should be --7/1988--. |

Column 4, line 48, "portion" should be --portions--.
Column 5, line 1, "steps" should be --straps--.

Signed and Sealed this

Nineteenth Day of October, 1993

BRUCE LEHMAN

*Attest:*

*Attesting Officer*   Commissioner of Patents and Trademarks